United States Patent
Nakao et al.

(10) Patent No.: US 8,546,185 B2
(45) Date of Patent: Oct. 1, 2013

(54) METHOD FOR MANUFACTURING SEMICONDUCTOR DEVICE

(75) Inventors: Ken Nakao, Nirasaki (JP); Muneo Harada, Nirasaki (JP); Itaru Iida, Nirasaki (JP); Eiji Yamaguchi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 68 days.

(21) Appl. No.: 13/399,482

(22) Filed: Feb. 17, 2012

(65) Prior Publication Data

US 2012/0252164 A1 Oct. 4, 2012

(30) Foreign Application Priority Data

Mar. 30, 2011 (JP) .................. 2011-74001

(51) Int. Cl.
*H01L 21/50* (2006.01)
(52) U.S. Cl.
USPC .................. 438/107; 438/613; 257/E21.499
(58) Field of Classification Search
USPC .................. 438/107, 460
See application file for complete search history.

(56) References Cited

U.S. PATENT DOCUMENTS

| | | | | |
|---|---|---|---|---|
| 7,851,336 B2 * | 12/2010 | Poplavskyy et al. | .......... | 438/479 |
| 8,455,349 B2 * | 6/2013 | Sasaki et al. | .......... | 438/629 |
| 2006/0252174 A1 * | 11/2006 | Maeda et al. | .......... | 438/75 |
| 2007/0099345 A1 * | 5/2007 | Bauer et al. | .......... | 438/107 |
| 2009/0267194 A1 * | 10/2009 | Chen | .......... | 257/621 |
| 2010/0093131 A1 * | 4/2010 | Maeda | .......... | 438/107 |
| 2011/0012266 A1 * | 1/2011 | Horiuchi et al. | .......... | 257/773 |

FOREIGN PATENT DOCUMENTS

| | | |
|---|---|---|
| JP | 2006-28667 A | 10/2006 |
| JP | 2009-110995 A | 5/2009 |
| JP | 2010-287852 A | 12/2010 |

* cited by examiner

*Primary Examiner* — Alexander Ghyka
(74) *Attorney, Agent, or Firm* — Nath, Goldberg & Meyer; Jerald L. Meyer

(57) ABSTRACT

Provided is a method for manufacturing a semiconductor device which includes: providing a plurality of semiconductor substrates formed with through holes which penetrate between main surfaces of the substrates and are filled with porous conductors; stacking the plurality of semiconductor substrates while aligning the porous conductors filled in the through holes; introducing conductive ink containing particle-like conductors into the porous conductors of the plurality of stacked semiconductor substrates; and sintering the plurality of stacked semiconductor substrates.

3 Claims, 27 Drawing Sheets

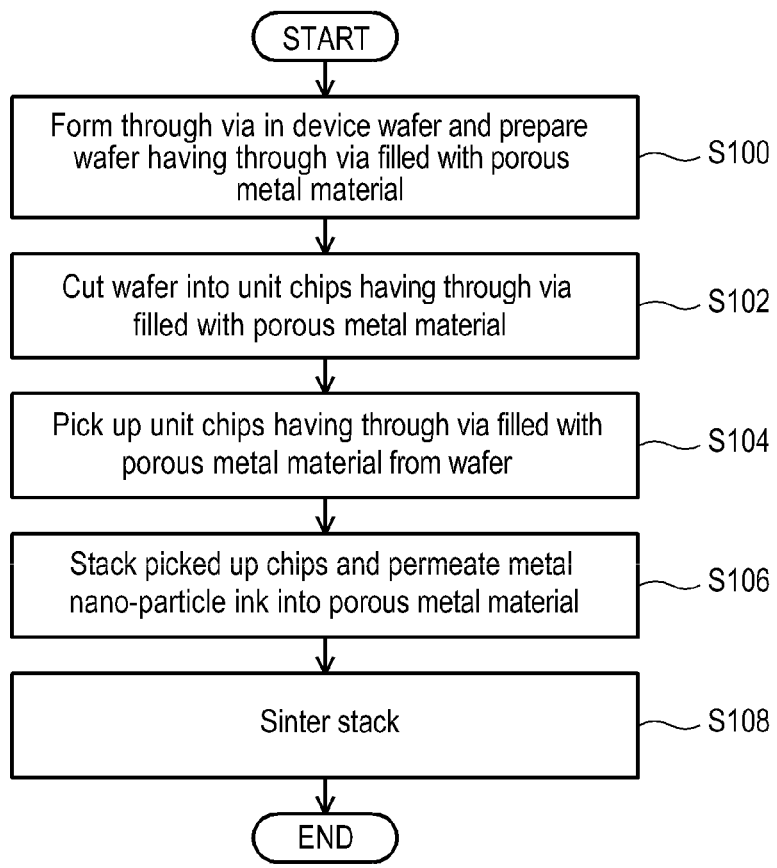

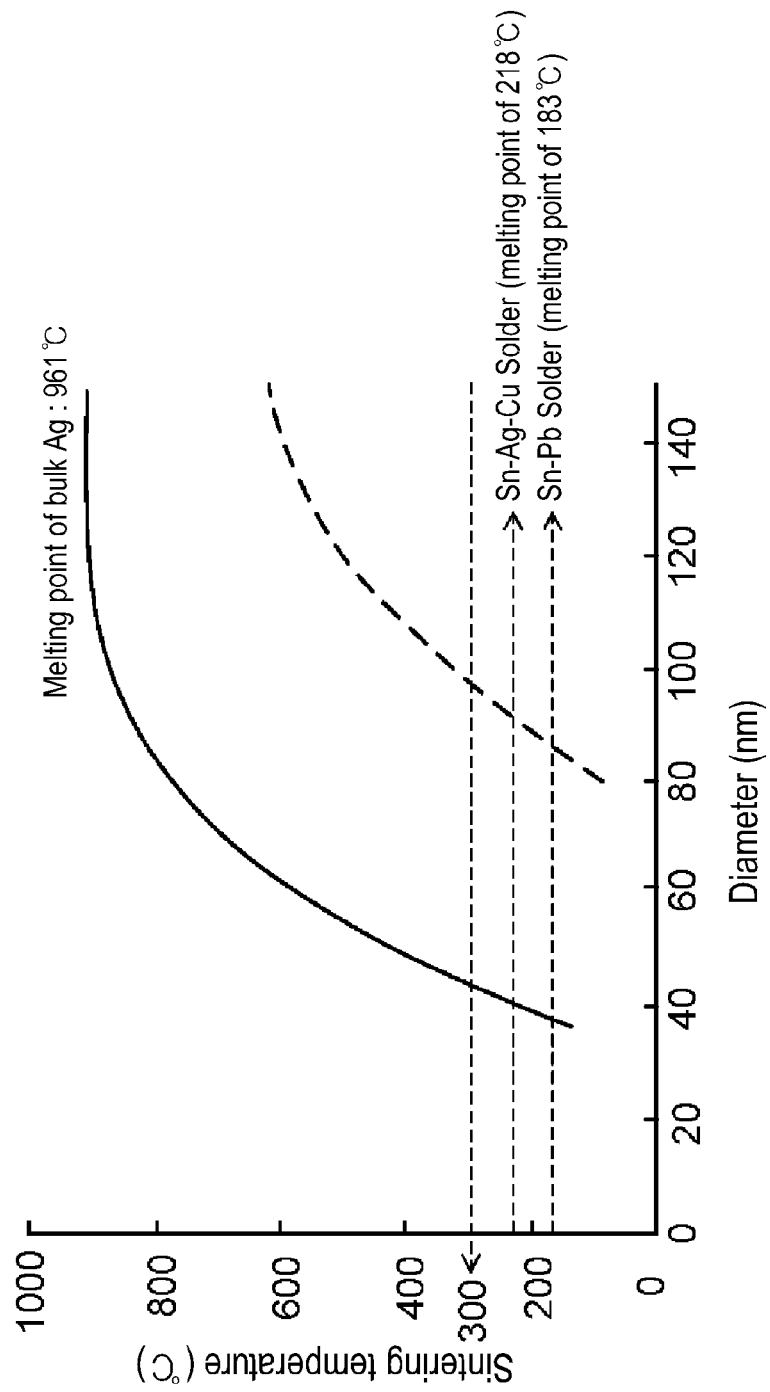

Ag particles 100 nm, After sintering at 300 °C

METHOD FOR MANUFACTURING SEMICONDUCTOR DEVICE

CROSS-REFERENCE TO RELATED APPLICATIONS

This application claims the benefit of Japanese Patent Application No. 2011-74001, filed on Mar. 30, 2011 in the Japan Patent Office, the disclosure of which is incorporated herein in its entirety by reference.

TECHNICAL FIELD

The present disclosure relates to a method for manufacturing a semiconductor device.

BACKGROUND

In recent years, high integration of semiconductor devices has progressed. However, when a plurality of highly-integrated semiconductor devices are placed on a horizontal plane and are connected by wirings for production, wiring length may be increased, which results in an increase in wiring resistance and wiring delay.

To overcome this problem, there has been proposed a three dimensional integration technique for stacking semiconductor devices in three dimensions. In this three dimensional integration technique, a substrate incorporating integrated circuits is divided into chips, and chips verified as chips having low defects through a test for determining chips having low defects performed before the divided chips are selected and stacked on another substrate to form a three dimensional stack (stack chip).

Such a stack chip is typically manufactured as follows. (1) A cohesive sheet such as a dicing tape or a backgrinding tape is attached to a substrate formed with semiconductor devices from a device-formed side in which the semiconductor devices are formed. (2) The substrate having the cohesive sheet attached to the device-formed side is grinded and thinned to a predetermined thickness from the opposite side to the device-formed side, that is, the back side of the substrate. (3) The thinned substrate is diced with the cohesive sheet attached to the substrate and is divided into individual chips, which are then detached from the cohesive sheet and are stacked.

The chip stacking is realized by overlaying chips by forming a film by means of plating using Sn, Cu or the like on through electrodes formed on the chips or by arranging solder balls on the through electrodes, deoxidizing the chips by means of a flux or the like in a heating apparatus, and bonding the chips together by pressurization under the condition of a solder melting point or higher.

The semiconductor device manufacturing method using such a three dimensional integration technique requires a high processing precision for the through electrodes arranged and interconnected on the chips. In addition, there is a need of processing of a flux used for soldering and an adhesive or a sticking agent for temporarily fixing the stacked chips.

SUMMARY

According to one embodiment of the present disclosure, there is provided a method for manufacturing a semiconductor device, the method including: providing a plurality of semiconductor substrates formed with through holes which penetrate between main surfaces of the substrates and are filled with porous conductors; stacking the plurality of semiconductor substrates while aligning the porous conductors filled in the through holes; introducing conductive ink containing particle-like conductors into the porous conductors of the plurality of stacked semiconductor substrates; and sintering the plurality of stacked semiconductor substrates.

According to another embodiment of the present disclosure, there is provided a method for manufacturing a semiconductor device, the method including: forming a plurality of chip areas on semiconductor substrates, each of the plurality of chip areas having through holes penetrating between main surfaces of the substrates; filling the through holes with porous conductors; cutting a plurality of chips from the plurality of chip areas; stacking the plurality of chips cut from the plurality of chip areas into a plurality of stacked chips while aligning the porous conductors; introducing conductive ink containing particle-like conductors into the porous conductors of the plurality of stacked chips; and sintering the plurality of stacked chips.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 2 is a flow chart showing a process of a manufacturing method according to an embodiment.

FIG. 8A is a graph showing a relationship between a silver particle diameter and a sliver sintering temperature.

DETAILED DESCRIPTION (Outline of Manufacturing Method of Embodiment)

An embodiment of the present disclosure will now be described in detail with reference to the drawings. FIGS. 1A to 1H are sectional views of a semiconductor device in a process of a manufacturing method according to an embodiment and FIG. 2 is a flow chart showing the processes. The manufacturing method of this embodiment includes a through via forming process, a chip cutting process, a chip pickup process, a chip stacking process and a chip sintering process.

[Through Via Forming Process]

First, a through via is formed in a device wafer 10 and a wafer 1 having a through via filled with porous metal material 54 is prepared (Step 100, which is hereinafter referred to as "S100," which is equally applied to other steps).

Figure 1A:
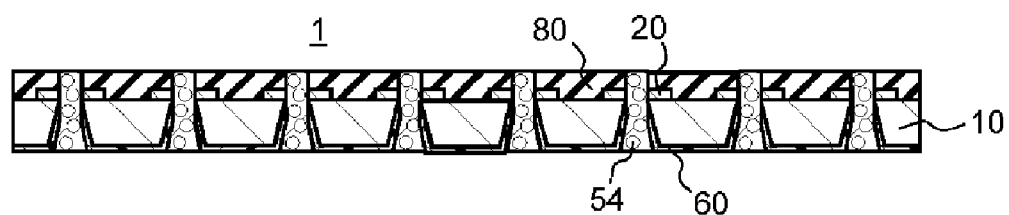
FIG. 1A is a sectional view of a semiconductor device in a process of a manufacturing method according to an embodiment.

As shown in FIG. 1A, an electrode pad 20 constituting a circuit is formed on one main surface of the device wafer 10 and a concave portion (or a through hole) corresponding to a position of the through via is formed in the electrode pad 20. A through hole (through via) penetrating through the device wafer 10 is formed in the concave portion of the electrode pad 20. An insulating layer 60 is formed on the other main surface of the device wafer 10. The insulating layer 60 is also formed on an inner wall of the through via formed in the device wafer 10. A dicing tape 80 is adhered to a portion of the main surface of the device wafer 10 on which the electrode pad 20 is formed. The metal nano-particle paste containing large-sized nano-metal particles is introduced into the through via and is temporarily sintered.

With the above process, the wafer 1 having the through via filled with porous metal material 54 can be obtained. The metal nano-particle paste is prepared by making metal particles, such as silver or the like, having a particle diameter of, for example, about 100 nm or more in the form of a paste using a certain medium. The metal nano-particle paste is introduced into the through via, with its viscosity properly adjusted, and is temporarily sintered to provide a porous through conductor (porous metal material 54).

[Chip Cutting]

Figure 1B:
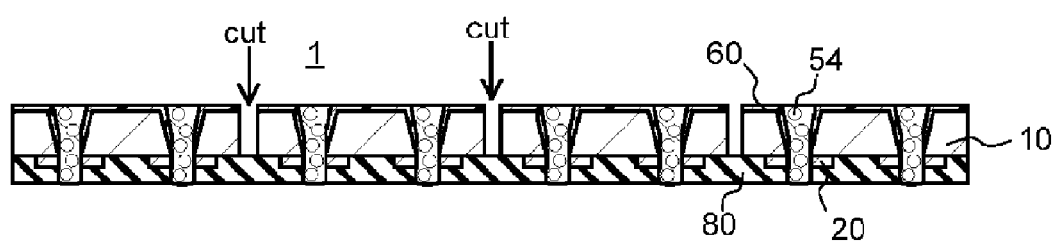
FIG. 1B is a sectional view of a semiconductor device in a process of a manufacturing method according to an embodiment.

Subsequently, the wafer 1 is cut into unit chips 2 having the through via filled with the porous metal material 54 (S102). With the dicing tape 80 left in the wafer 1, the device wafer 10 is diced to separate the unit chips 2 (FIG. 1B).

[Chip Pickup]

Figure 1C:
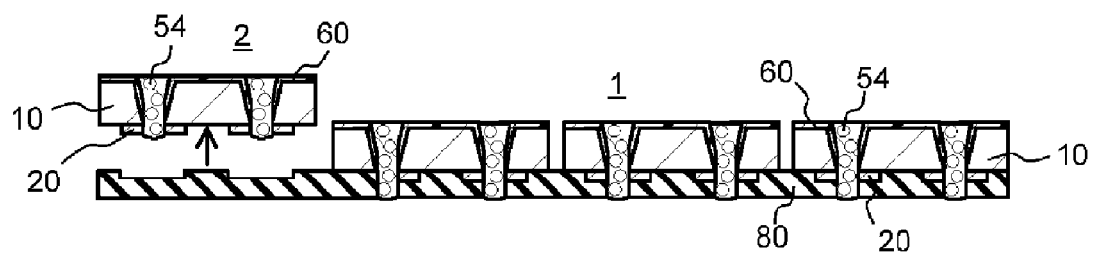
FIG. 1C is a sectional view of a semiconductor device in a process of a manufacturing method according to an embodiment.

When the dicing to cut the chip 2 is completed, the chips 2 are picked up from the wafer 1 (S104). The chips 2 cut with the dicing tape 80 left is taken out by a pickup device (FIG. 1C).

[Chip Stacking]

When the chips 2 are separated from the wafer 1, the picked chips 2 are stacked and metal nano-particle ink is permeated into the porous metal 54 (S106).

Figure 1D:
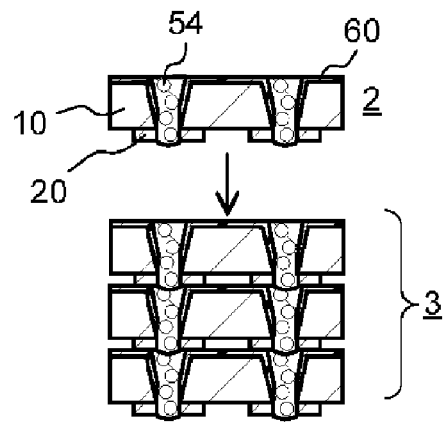
FIG. 1D is a sectional view of a semiconductor device in a process of a manufacturing method according to an embodiment.
Figure 1E:
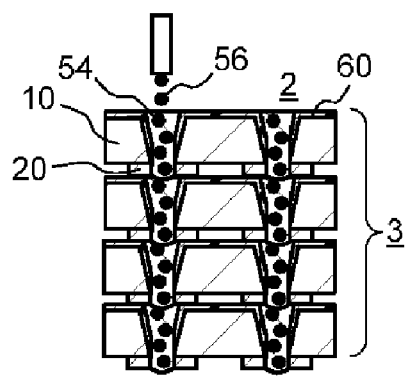
FIG. 1E is a sectional view of a semiconductor device in a process of a manufacturing method according to an embodiment.

As shown in FIG. 1D, with the through via filled with the porous metal material 54 being aligned, the chips 2 are stacked to form a stack 3. After the chips 2 are stacked, metal nano-particle ink 56 is injected into the porous metal 54 in the through via of the uppermost chip (FIG. 1E). The metal nano-particle ink 56 is prepared by making metal particles, such as silver or the like, having a particle diameter of, for example, several nm to 30 nm in the form of ink using a certain medium. The metal nano-particle ink 56 is prepared to have a viscosity smaller than that of the metal nano-particle paste filled in the through via. In addition, the metal nano-particle ink 56 injected into the porous metal material 54 is in some embodiments prepared using the same kind of metal as the porous metal 54 (metal nano-particle paste) filled in the through via.

[Sintering]

Figure 1F:
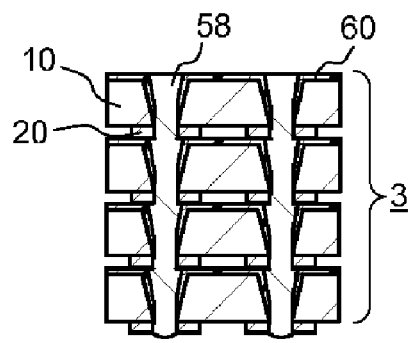
FIG. 1F is a sectional view of a semiconductor device in a process of a manufacturing method according to an embodiment.

After a suitable amount of the metal nano-particle ink 56 is injected into the porous metal material 54 in the through via, the stack 3 is sintered (S108). The metal nano-particle paste and the metal nano-particle ink are melted by this sintering process to thereby achieve an integrated through conductor 59 (FIG. 1F).

In the manufacturing method of the embodiment, since the porous metal material made by sintering the metal nano-particle paste is beforehand filled in the through via of the chips and the metal nano-particle ink is injected and sintered after the chips are stacked, a precision of stacking and processing is not required as compared to making a connection between through conductors of chips using welding. That is, a simple apparatus may be used to form through conductors of the stacked chips. This means that a finer through via structure (through conductor structure) can be formed as compared to when a stacked chip structure is formed using welding. In addition, since the through conductor is integrally formed by sintering without using a solder, a process using an adhesive, cohesive material or the like is not required.

In addition, when the metal nano-particle paste (porous metal material) filled in the through via of the chips is formed of the same kind of metal as the metal nano-particle ink injected into the porous metal after the chips are stacked, resistance of the through conductor can be reduced.

Figure 1G:
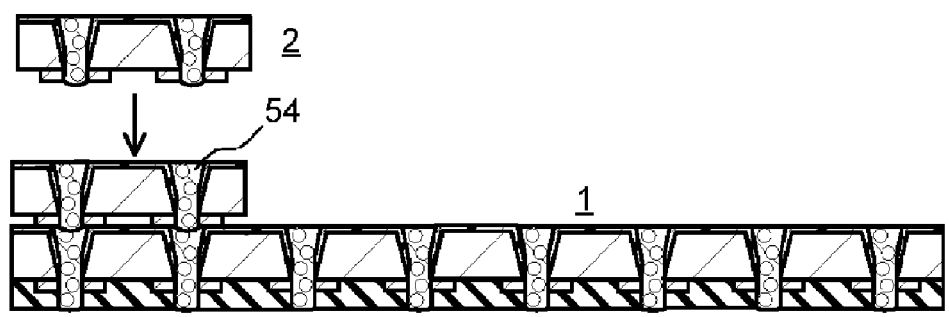
FIG. 1G is a sectional view of a semiconductor device in a process of a manufacturing method according to an embodiment.
Figure 1H:
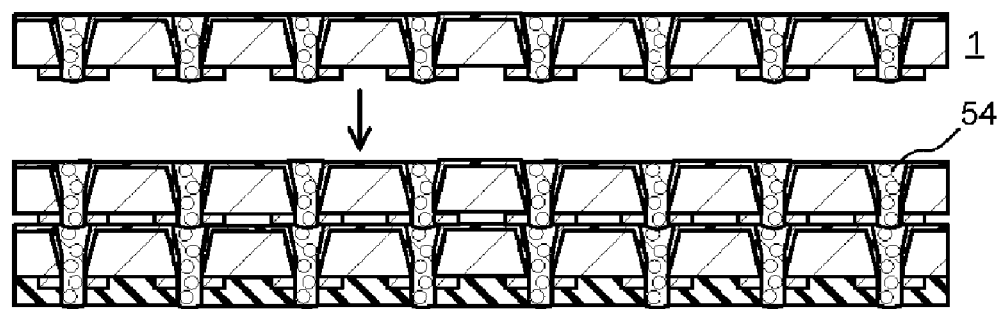
FIG. 1H is a sectional view of a semiconductor device in a process of a manufacturing method according to an embodiment.

In addition, although the cut chips 2 are stacked in the method of the embodiment shown in FIGS. 1A to 1F, the present disclosure is not limited thereto. As shown in FIG. 1G, the chips 2 may be formed in the wafer 1 having chips 2 not cut (Chip On Wafer (COW)). In addition, as shown in FIG. 1H, the wafer 1 having a through via filled with the porous metal material 54 may be stacked as it is without cutting the chips (Wafer On Wafer (WOW)).

In addition, in the processes shown in FIGS. 1B to 1D, the chips 2 are cut, and then, they are picked up and stacked with the dicing tape 80 left and the electrode pad 20 directed downward. However, the present disclosure is not limited thereto. For example, a separate tape may be attached to a surface (a surface with the insulating layer 60 formed thereon) other than a surface with the electrode pad 20 of the device wafer 10 formed thereon, and thereby, the dicing tape 80 may be separated and the chips 2 may be picked up and stacked with the separate tape left and with the electrode pad 20 formed surface directed upward. In this case, the electrode pad 20 is positioned on the top of the stack.

Details of Manufacturing Method of Embodiment

Figure 3A:
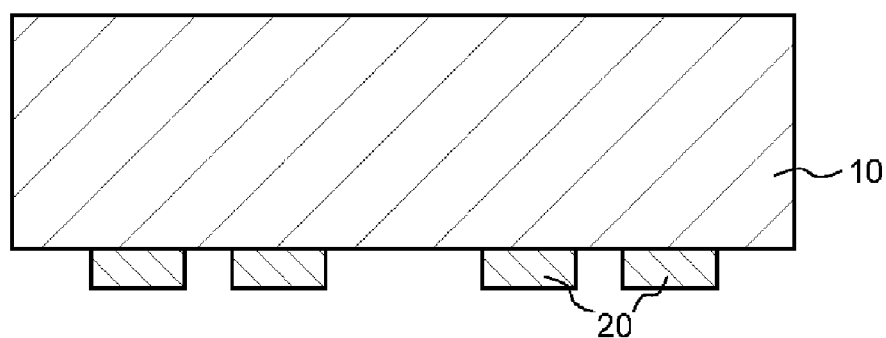
FIG. 3A is a sectional view of a semiconductor device in a process of forming a through via in a manufacturing method according to an embodiment.
Figure 4A:
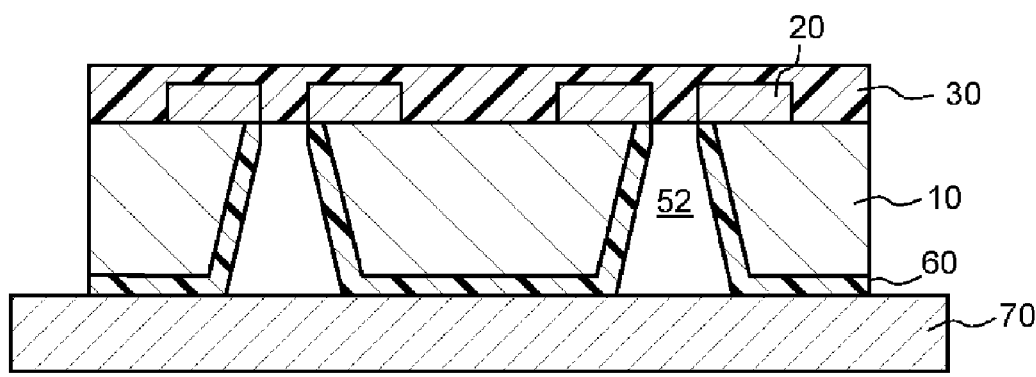
FIG. 4A is a sectional view of a semiconductor device in a process of peeling off a support substrate in a manufacturing method according to an embodiment.
Figure 4B:
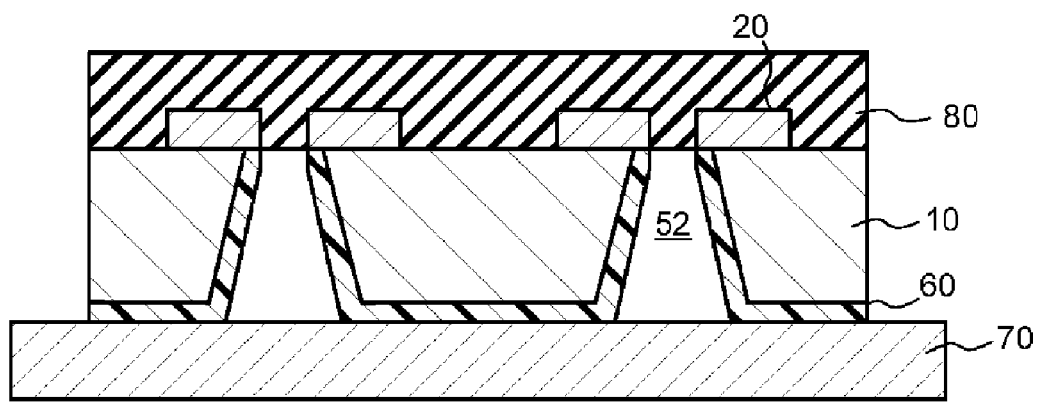
FIG. 4B is a sectional view of a semiconductor device in a process of peeling off a support substrate in a manufacturing method according to an embodiment.
Figure 4C:
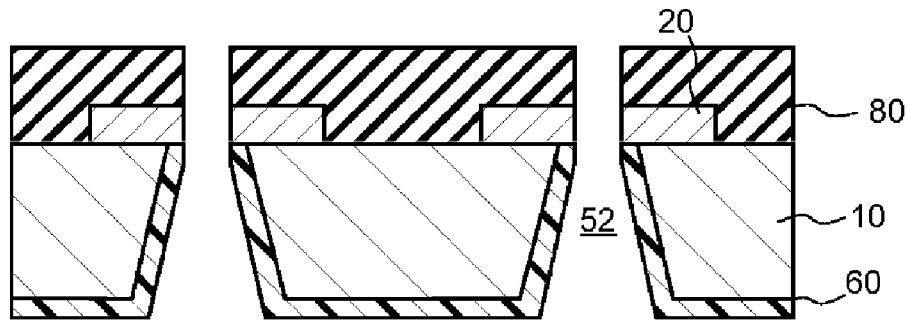
FIG. 4C is a sectional view of a semiconductor device in a process of peeling off a support substrate in a manufacturing method according to an embodiment.
Figure 5A:
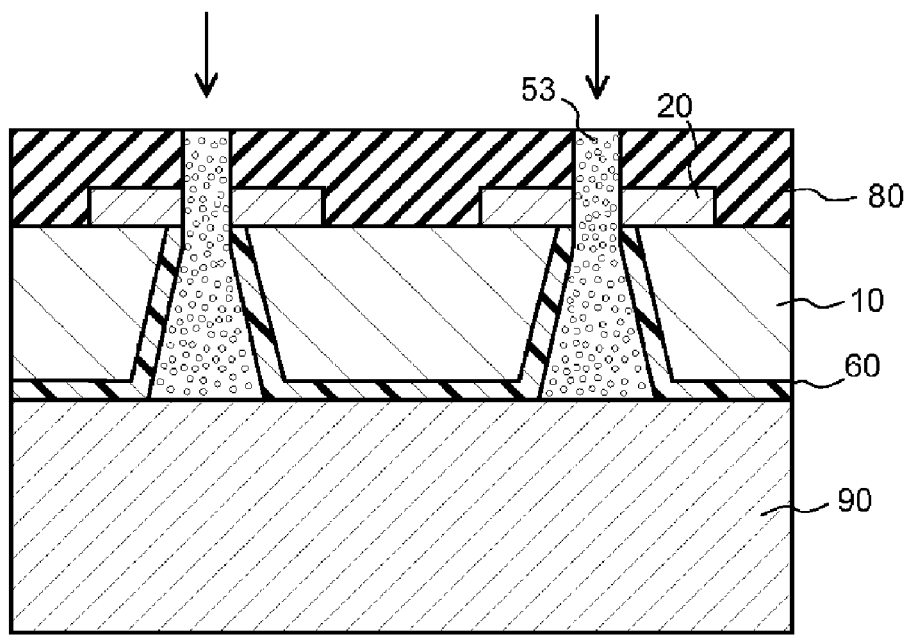
FIG. 5A is a sectional view of a semiconductor device in a process of filling porous metal material in a manufacturing method according to an embodiment.
Figure 5B:
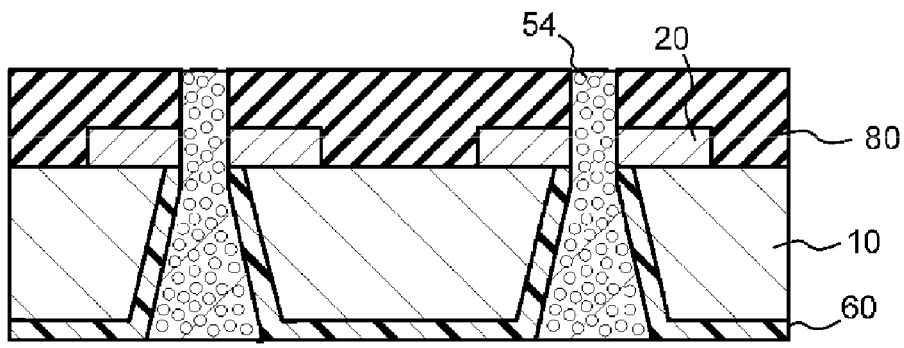
FIG. 5B is a sectional view of a semiconductor device in a process of filling porous metal material in a manufacturing method according to an embodiment.
Figure 6A:
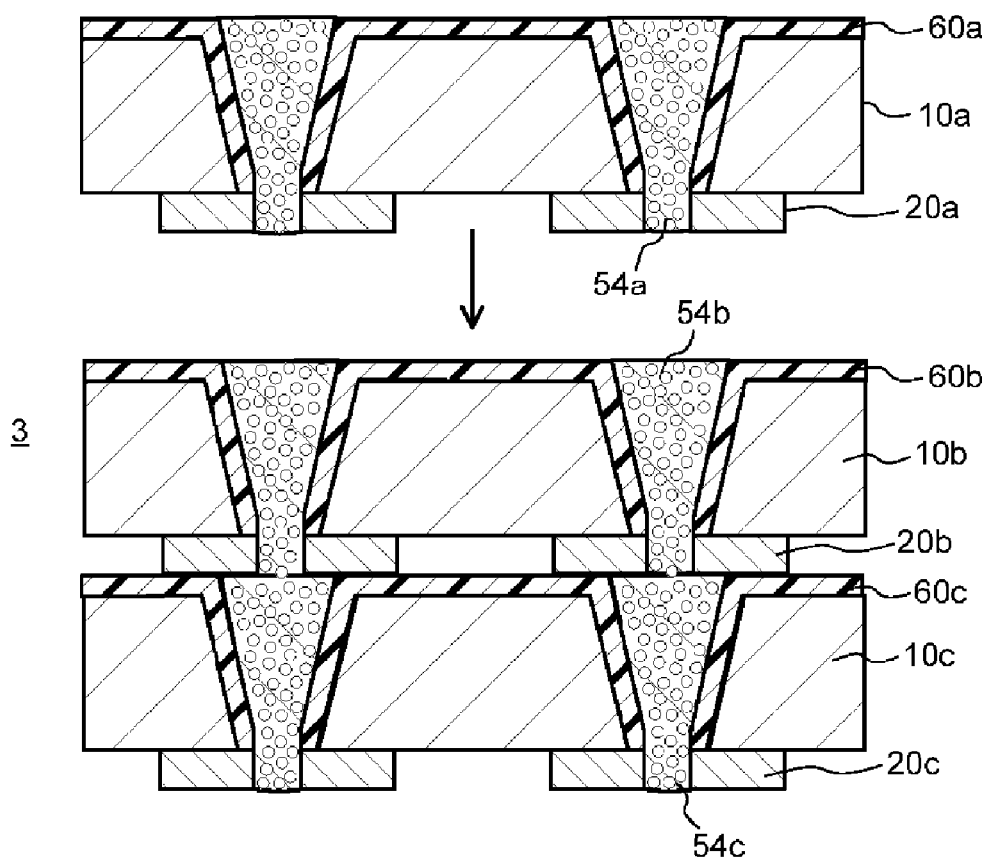
FIG. 6A is a sectional view of a semiconductor device in a deposition process in a manufacturing method according to an embodiment.

Next, each process of through via forming and chip (wafer) stacking and sintering in the manufacturing method of the embodiment will be described in more detail with reference to FIGS. 3A to 3G, FIGS. 4A to 4C, FIGS. 5A and 5B, FIGS. 6A to 6D and FIG. 7. FIGS. 3A to 3G are sectional views showing sections of a semiconductor device in a process of forming a through via according to an embodiment. FIGS. 4A to 4C are sectional views of a semiconductor device in a process of peeling off a support substrate according to an embodiment. FIGS. 5A and 5B are sectional views of a semiconductor device in a process of filling porous metal material in a manufacturing method according to an embodiment. FIGS. 6A to 6D are sectional views of a semiconductor device in a stacking process according to an embodiment. FIG. 7 is a flow chart showing details of a process of a manufacturing method according to an embodiment. In the following description, the same elements as those shown in FIGS. 1A to 1H are denoted by the same reference numerals and an explanation of which will not be repeated. In addition, in the following description, explanation of a dicing process of cutting chips out of a wafer will be omitted.

[Wafer Preparation and Through Via Forming]

First, a wafer 1 is prepared and a through via is formed. As shown in FIG. 3A, an electrode pad 20 constituting a circuit is formed on one main surface of a device wafer 10 (S200). The device wafer 10 is formed of, for example, a silicon substrate or the like and the electrode pad 20 is made of conductive material such as, for example, copper, silver, aluminum, nickel, gold or the like. The electrode pad 20 is formed on the main surface of the device wafer 10 by, for example, plating or the like. As shown in FIG. 3A, a concave portion or a through hole is formed in the central portion of the electrode pad 20 in a surface direction of the device wafer 10. The concave portion or through hole is formed by etching or the like.

Figure 3B:
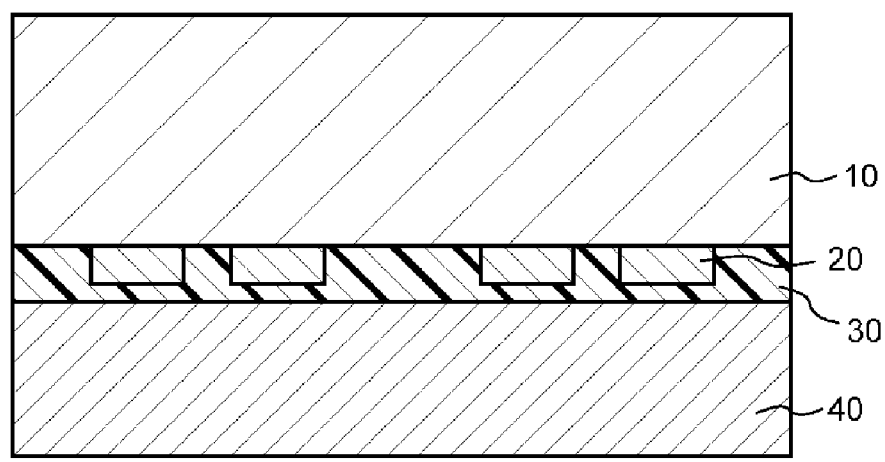
FIG. 3B is a sectional view of a semiconductor device in a process of forming a through via in a manufacturing method according to an embodiment.

Next, as shown in FIG. 3B, a surface with the electrode pad 20 formed thereon of the device wafer 10 is directed to face and is adhered to a support substrate 40 by means of an adhesive 30 (S202). The support substrate 40 acts as a base holding the device wafer 10. The adhesive 30 may be, for example, a UV curable adhesive, a thermoplastic adhesive or the like and detachably bonds the device wafer 10 to the support substrate 40.

Figure 3C:
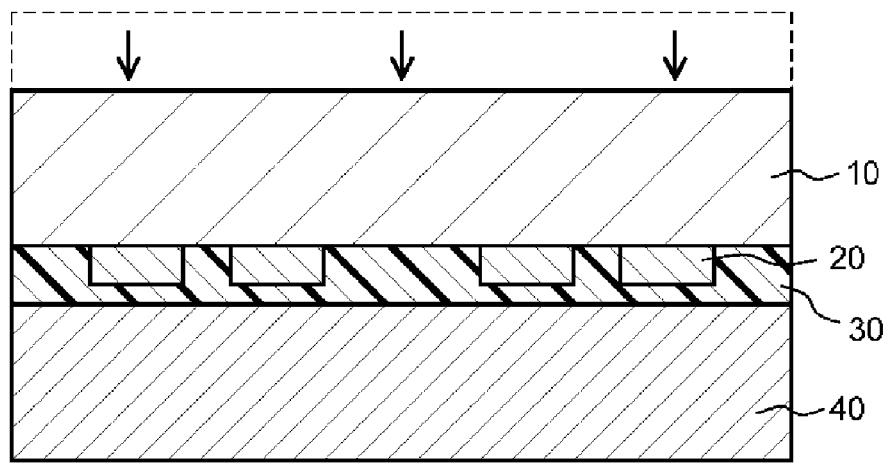
FIG. 3C is a sectional view of a semiconductor device in a process of forming a through via in a manufacturing method according to an embodiment.
Figure 3D:
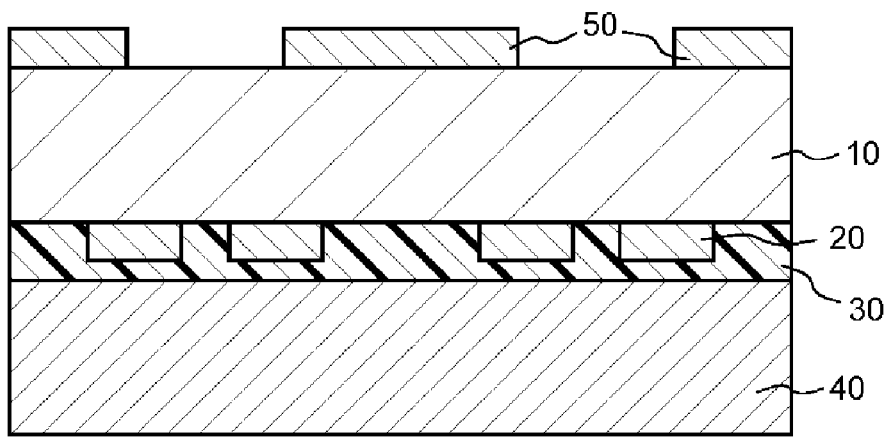
FIG. 3D is a sectional view of a semiconductor device in a process of forming a through via in a manufacturing method according to an embodiment.

Subsequently, as shown in FIG. 3C, a portion other than a portion of the main surface of the device wafer 10 where the support substrate 40 is adhered is ground, and the device wafer 10 is processed to be thinned (S204). The device wafer 10 is adjusted to a thickness appropriate for stacking of chips (or wafers).

When the device wafer 10 is thinned up to a predetermined thickness, a resist layer 50 is formed on the ground surface of the device wafer 10. A resist opening corresponding to a position of forming the through hole is formed in the resist layer 50. That is, the resist opening is formed at a position corresponding to the concave portion or through hole of the electrode pad 20 in the resist layer 50.

Figure 3E:
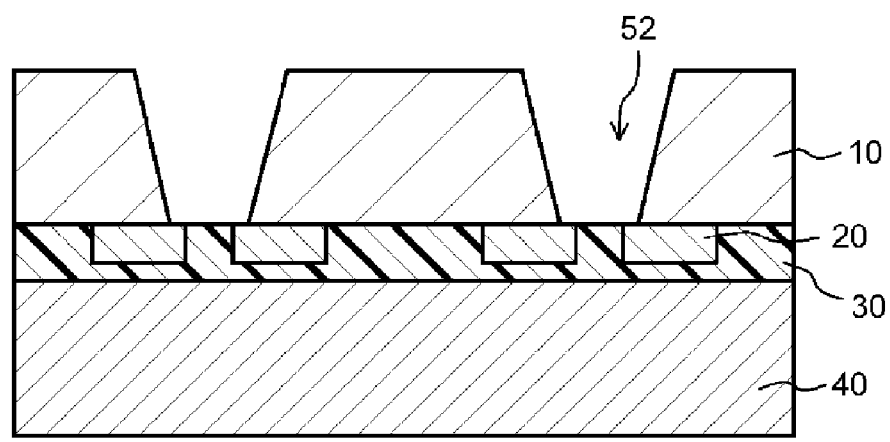
FIG. 3E is a sectional view of a semiconductor device in a process of forming a through via in a manufacturing method according to an embodiment.

Subsequently, as shown in FIG. 3E, a surface with the resist layer 50 formed thereon in the device wafer 10 is etched to form a through via 52 in the device wafer 10. In addition, the resist layer 50 remaining after completion of the etching is removed.

Figure 3F:
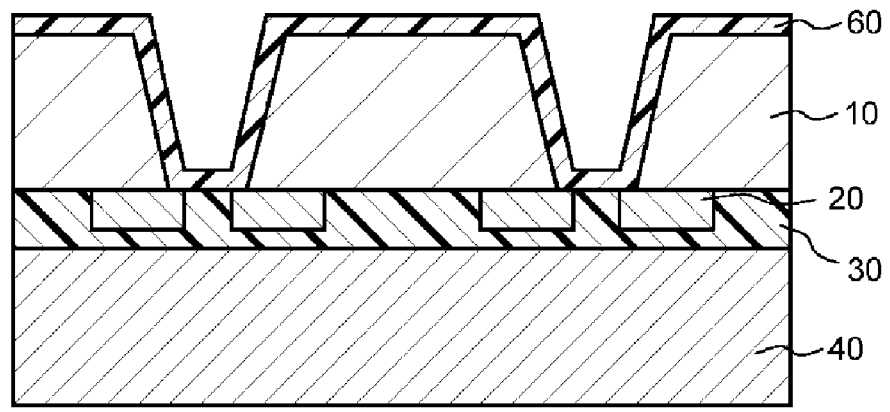
FIG. 3F is a sectional view of a semiconductor device in a process of forming a through via in a manufacturing method according to an embodiment.

After the through via is formed in the device wafer 10, an insulating layer 60 is formed on a through via opening surface (a surface other than the surface with the electrode pad 20 formed thereon) of the device wafer 10 (S210). As shown in FIG. 3F, the insulating layer 60 is formed in the inner wall or bottom of the through via 52 as well as the front surface of the device wafer 10.

Figure 3G:
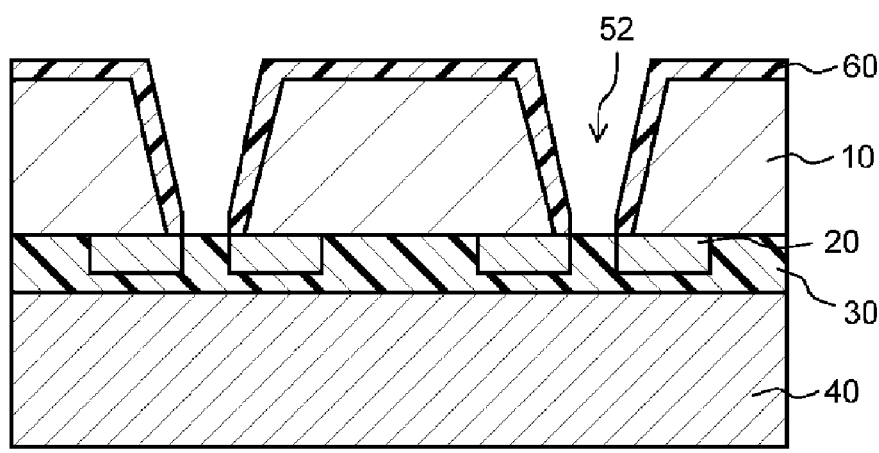
FIG. 3G is a sectional view of a semiconductor device in a process of forming a through via in a manufacturing method according to an embodiment.

Subsequently, as shown in FIG. 3G, the insulating layer 60 in the bottom of the through via 52 of the device wafer 10 is removed using a laser or the like (S212). The through via 52 of the device wafer 10 is completed by the processes from Step 200 to Step 212.

[Support Substrate Peeling]

After the through via 52 of the device wafer 10 is completely formed, as shown in FIG. 4A, the device wafer 10 is separated from the support substrate 40 and is placed on a chuck 70, while a surface with the insulating layer 60 formed thereon of the device wafer 10 (a surface other than the surface with the electrode pad 20 formed thereon) facing the chuck 70 (S214). In addition, when the device wafer 10 is separated from the support substrate 40, the residual adhesive 30 may be removed.

Next, as shown in FIG. 4B, the dicing tape 80 is attached to a surface with the electrode pad 20 formed thereon of the device wafer 10 (S216), and as shown in FIG. 4C, the chuck 70 is separated from the device wafer 10 while removing a corresponding portion of the through via 52 of the dicing tape 80 (S218). The removal of the corresponding portion of the through via of the dicing tape 80 may be realized by laser light irradiation. The porous metal material is ready for filling by the processes from Step 214 to Step 218.

[Porous Metal Material Filling]

Subsequently, as shown in FIG. 5A, while the surface of the device wafer 10 (the surface with the insulating layer 60 formed thereon) other than the surface with the dicing tape 80 attached thereto facing a porous material 90, the device wafer 10 is disposed on the porous material 90. After the device wafer 10 is disposed on the porous material 90, the metal nano-particle paste 53 is introduced from an opening on a surface of the dicing tape 80 while making the internal pressure of the through via 52 negative through the porous material 90 using a suction device (not shown) (S220). The metal nano-particle paste 53 may be prepared by making nano-silver particles having a diameter of, for example, about 100 nm in the form of a paste. The metal nano-particle paste 53 is in some embodiments introduced with its viscosity adjusted by a certain medium. The reason for making the internal pressure of the through via 52 negative through the porous material 90 is to facilitate introducing the metal nano-particle paste 53 into the through via.

After the metal nano-particle paste 53 is introduced into the through via 52, the device wafer 10 is temporarily sintered in its entirety (S222). This temporary sintering allows the metal nano-particle paste 53 to be changed into porous material and the porous metal material 54 to be formed in the through via 52. After the temporary sintering, the porous material 90 is separated from the device wafer 10 (FIG. 5B). The process described in Step 100 of FIG. 2 is completed by the processes up to Step 222.

[Stacking and Sintering]

After the porous metal material 54 is formed in the through via 52, the dicing tape 80 is separated from the device wafer 10, and the device wafer 10 is stacked with the through via 52 being aligned (S224). When manufacturing a stack of Chip On Chip or Chip on Wafer, the unit chips 2 may be stacked after being cut out of the device wafer 10 (FIG. 6A). That is, as shown in FIG. 6A, device wafers 10a to 10c are stacked after porous metal 54a to 54c filled in the through vias of the device wafers 10a to 10c are aligned on the same axis.

Figure 6B:
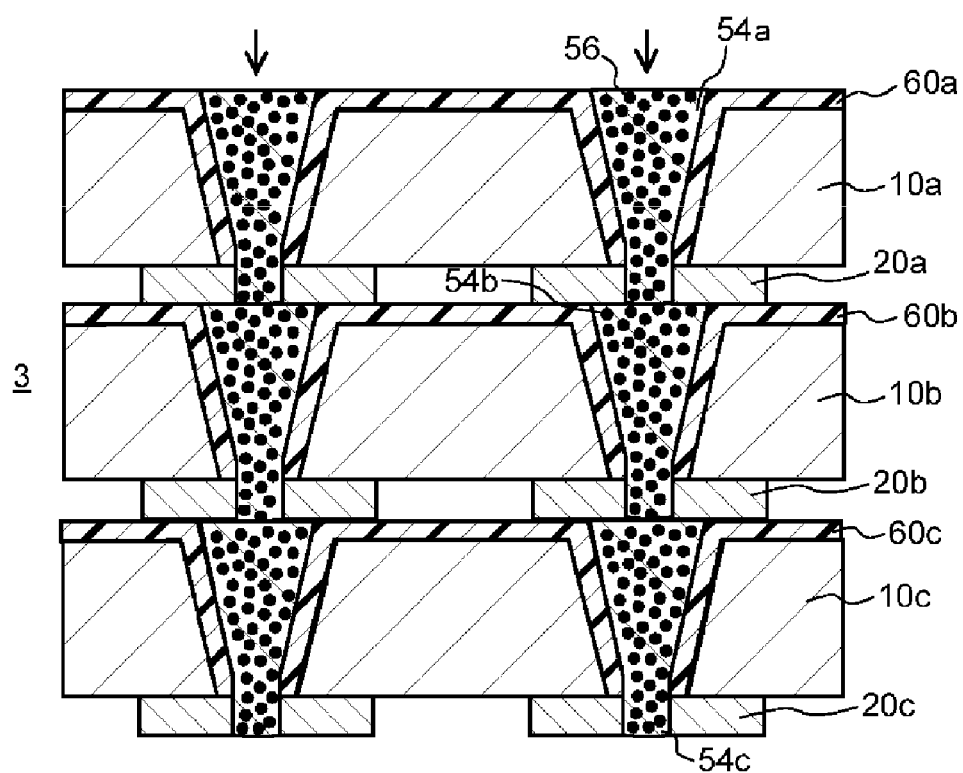
FIG. 6B is a sectional view of a semiconductor device in a deposition process in a manufacturing method according to an embodiment.
Figure 7:
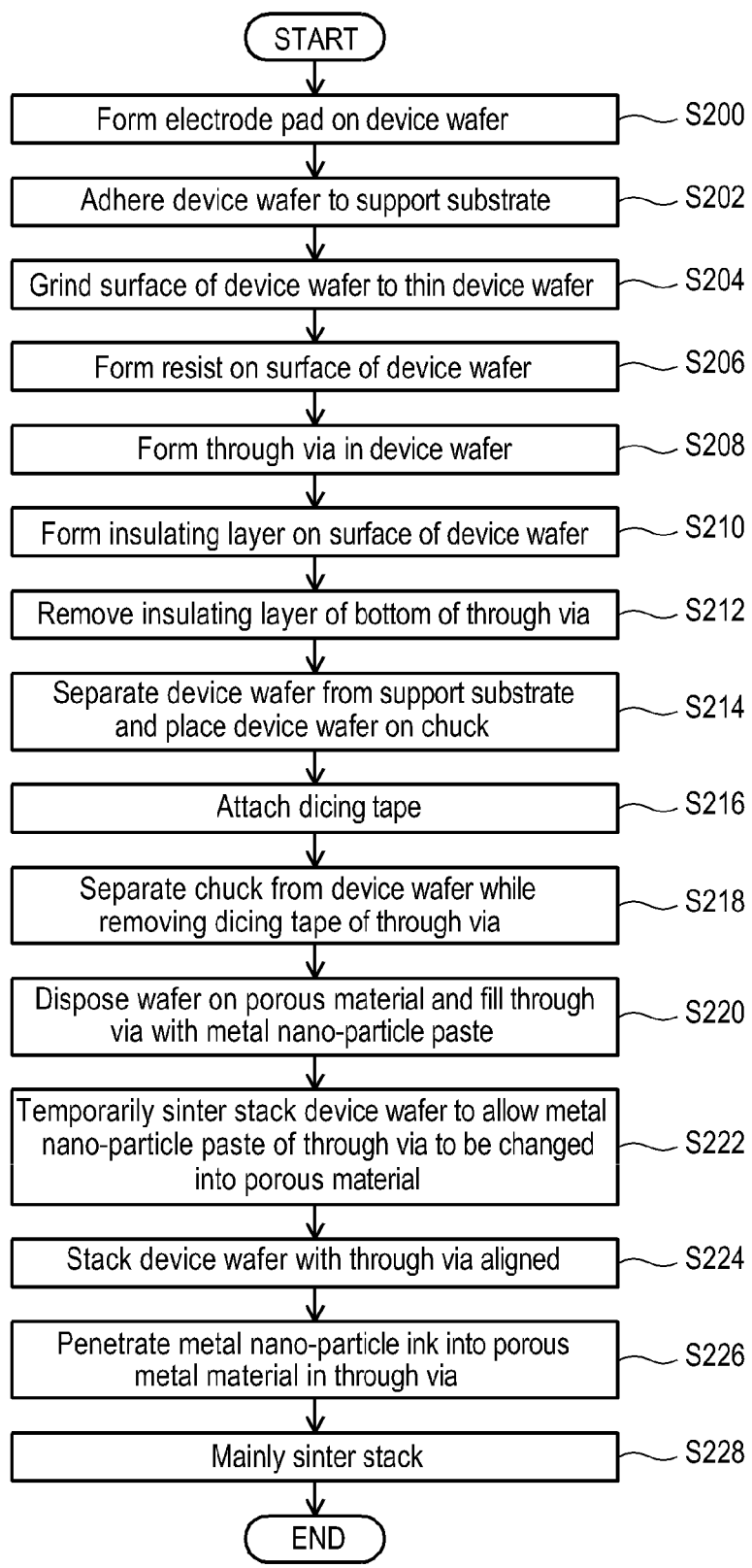
FIG. 7 is a flow chart showing details of a process of a manufacturing method according to an embodiment.

After the chips 2 (or the device wafer 10) are stacked into a stack 3, as shown in FIG. 6B, the metal nano-particle ink 56 is introduced from an opening on an insulating layer 60a of the device wafer 10a (or an opening of an electrode pad 20c of the device wafer 10c) (S226). The metal nano-particle ink 56 is prepared to have a viscosity lower than that of the metal nano-particle paste 53 introduced into the through via so that the ink 56 can be widely spread into the porous metal 54a to 54c, respectively. In addition, the metal nano-particle ink 56 and the metal nano-particle paste 53 are in some embodiments prepared using the same kind of metal.

Figure 6C:
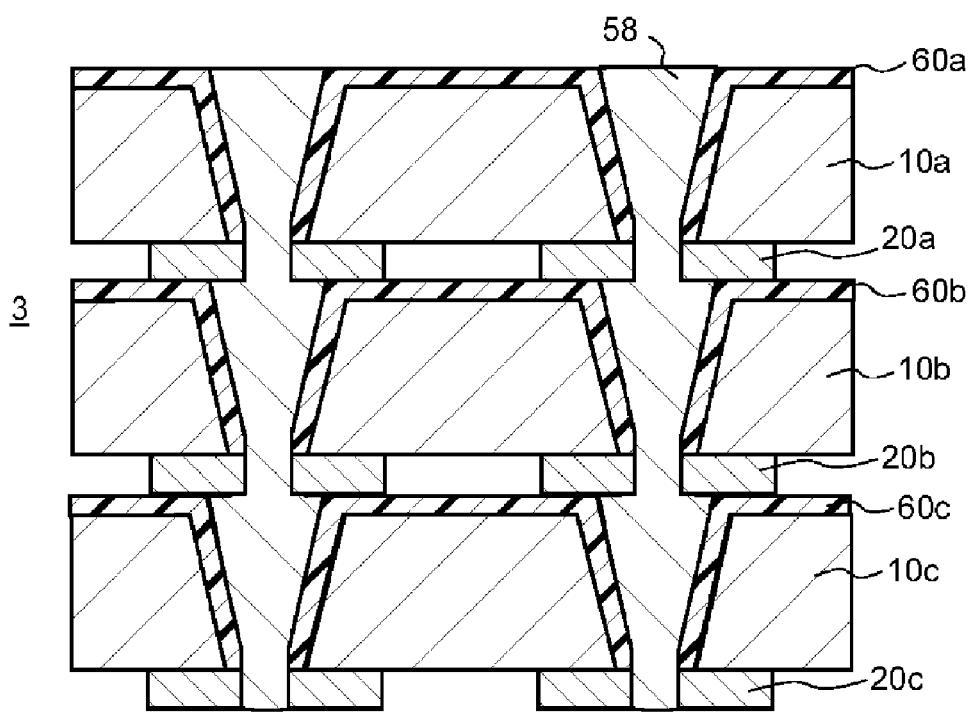
FIG. 6C is a sectional view of a semiconductor device in a deposition process in a manufacturing method according to an embodiment.
Figure 6D:
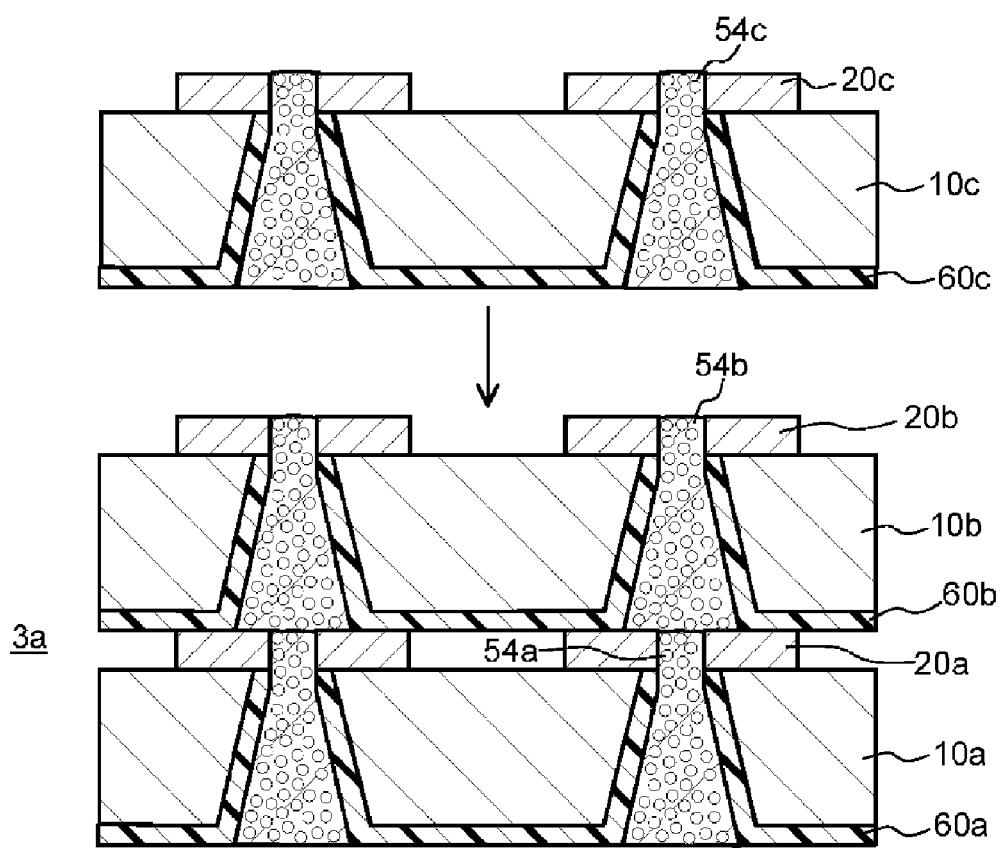
FIG. 6D is a sectional view of a semiconductor device in a deposition process in a manufacturing method according to an embodiment.

After a predetermined amount of metal nano-particle ink 56 is introduced into the porous metal 54a to 54c filled in the through via, the stack 3 is mainly sintered in its entirety (S228). The main sintering is performed under the temperature environment where the metal nano-particle ink 56 and the metal nano-particle paste 53 are integrally melted. As a result, the metal nano-particle ink and the metal nano-particle paste are melted to complete an integrated through conductor 58 (FIG. 6C).

In addition, although it is shown in FIGS. 5B to 6A that, after the porous metal material 54 is formed in the through via 52, the dicing tape 80 is separated from the device wafer 10 and the device wafer 10 is stacked with the electrode pad 20 directed downward, the present disclosure is not limited thereto. For example, a separate tape may be attached to a surface other than the surface with the electrode pad 20 formed thereon of the device wafer 10, and thereby, the dicing tape 80 may be separated and the device wafer 10 may be stacked while the surface with the electrode pad 20 formed thereon directed upward. In this case, the electrode pad 20 is positioned on the top of the stack 3a, as shown in FIG. 6D.

In this manner, in the manufacturing method of the embodiment, while the through via being formed in the device wafer 10, the through via is filled with the porous metal material, and the metal nano-particle ink is injected into the porous metal material after the device wafer 10 (or the chips 2) is stacked. This allows the through conductor to be integrally formed after the stacking. That is, it is possible to increase mechanical strength while decreasing electrical resistance as compared to conventional techniques where wafers or chips are stacked and soldered after a through conductor is buried in a through via.

In addition, since the metal nano-particle paste is beforehand introduced in the through via of the wafer or chips before the stacking to form the porous metal material and the metal nano-particle ink having a viscosity lower than that of the metal nano-particle paste is injected into the porous metal material of the through via after the stacking, it is possible to prevent a metal solution from dropping from the through via in the manufacturing process. In addition, since the metal nano-particle ink is sintered to be integrated after it is injected into the porous metal material in the through via, it is possible to form a uniform through conductor.

(Metal Nano-Particle Paste and Metal Nano-Particle Ink)

Subsequently, the metal nano-particle paste and the metal nano-particle ink used in the manufacturing method of the embodiment will be described with reference to FIGS. 8A to 8D.

In a three dimensional integration technique for stacking semiconductor devices in three dimensions, it is common that wafers and the like are stacked after semiconductor devices are formed and arranged on the wafers or chips. Therefore, if the wafers and the like are heated at a temperature (for example, 300 degrees C. or more) higher than a melting point of a solder, the semiconductor devices formed and arranged on the wafers or the like may be damaged. Accordingly, the wafers cannot be put under high temperature environments when the wafers are stacked.

It has been known that a melting point of metal material used for the through conductor is generally high. For example, since the melting point of silver in a bulk state is 961 degrees C., it is difficult to use the bulk silver as a through conductor of stacked wafers or the like. The present inventors have paid attention to the effect that a sintering temperature of metal material decreases if a particle diameter of the metal material is miniaturized to a nanometer level (for example, see FIG. 8C).

FIG. 8A shows a relationship between a silver particle diameter and a sliver sintering temperature. In FIG. 8A, a solid line denotes a relationship between a silver particle diameter and a sliver sintering temperature and a dashed line denotes a relationship between a silver particle diameter and a temperature at which a surface of silver particles begins to be melted. As shown in FIG. 8A, when the silver particle diameter is decreased, the sintering temperature tends to decrease in case of the particle diameter of 100 nm or less. In addition, it can be seen that the sintering temperature is 300 degrees C. or less when the silver particle diameter is about 40 nm or less, which is equal to the melting point of a typical solder (for example, Sn—Ag—Cu or Sn—Pb). That is, when silver particles having a particle diameter of about 40 nm or less are used, it is possible to sinter the silver particles at the same degree of temperature as the solder.

However, when a through conductor of stacked wafers is formed, metal material may be completely melted and flown out of the through via, which makes it difficult to manufacture it. In addition, if the porous metal material (metal nano-particle paste) and the metal nano-particle ink are not sintered at about the same temperature, the through conductor cannot be integrally formed. The present inventors have paid attention to the fact that a temperature at which a surface of metal particles begins to be melted becomes lower than a sintering temperature of the metal particles. That is, as shown in FIG. 8A, when the silver particle diameter is decreased, it can be seen that a surface of the silver particles having a diameter of about 100 nm or less begins to be melted at a temperature of 300 degrees C. or so.

Figure 8B:
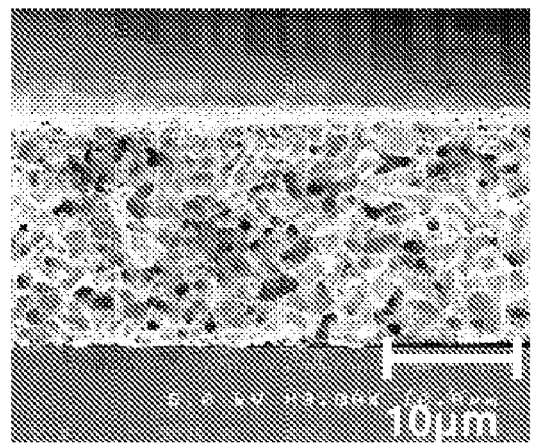
FIG. 8B is a sectional view of silver in a metal nano-particle paste.
Figure 8C:
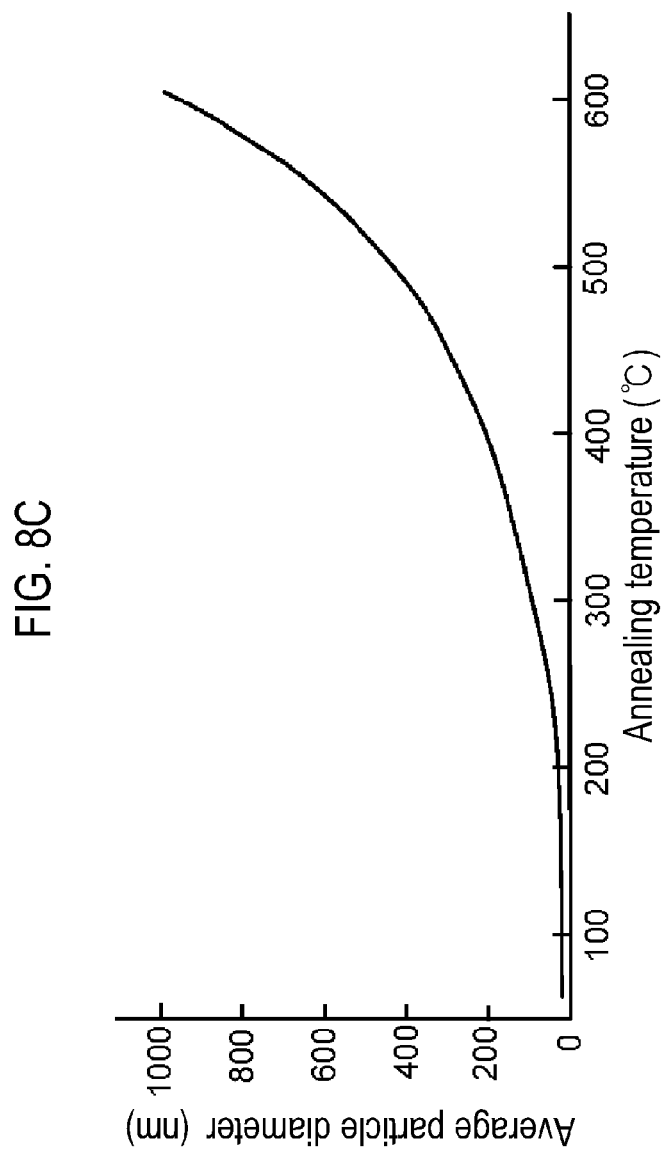
FIG. 8C is a graph showing a relationship between a silver annealing temperature and a silver average particle diameter.

FIG. 8B shows a section where silver particles having a diameter of 100 nm is sintered at 300 degrees C. As shown in FIG. 8B, when silver particles having a diameter of 100 nm is sintered under environments of 300 degrees C. or so, it can be seen that porous metal material can be formed. In addition, the same result can be expected for a mixture of silver particles having a diameter of 100 nm or less and silver particles having a diameter of 100 nm or more.

In this manner, when the metal nano-particle paste is prepared using the silver having a particle diameter of 100 nm or so (or the mixture of silver having a particle diameter of 100 nm or less and silver having a particle diameter of 100 nm or more), it is possible to form the porous metal material under the temperature environments of 300 degrees C. or so. In addition, when the metal nano-particle ink is prepared using silver particles having the diameter of 40 nm or less, it is possible to melt the silver particles of the metal nano-particle ink while melting the surface of the silver particles of the porous metal material under the temperature environments of 300 degrees C. or less. This means that an integrated through conductor can be formed under the temperature environment of a melting point or so of a solder by preparing the metal nano-particle paste and the metal nano-particle ink using the silver particles.

Figure 8D:
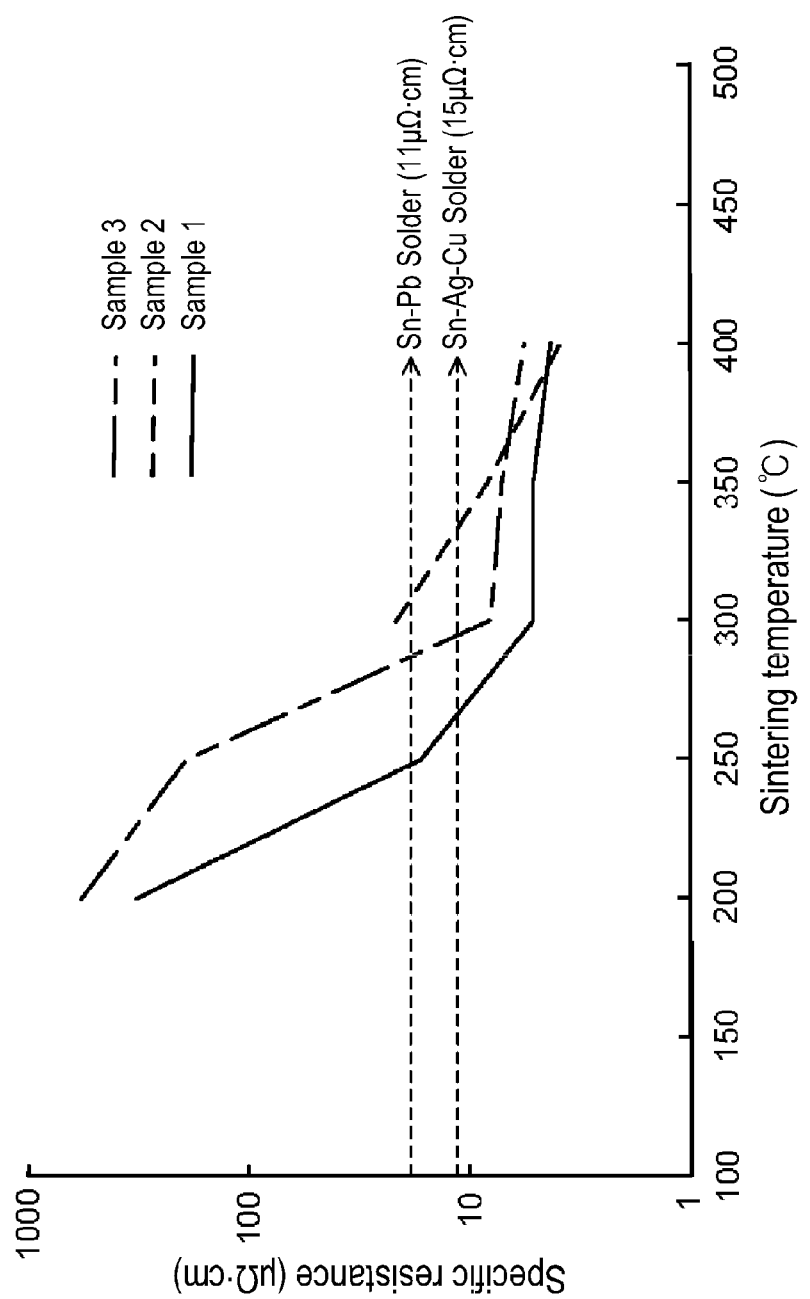
FIG. 8D is a graph showing a relationship between a silver sintering temperature and a silver specific resistance.
Figure 9A:
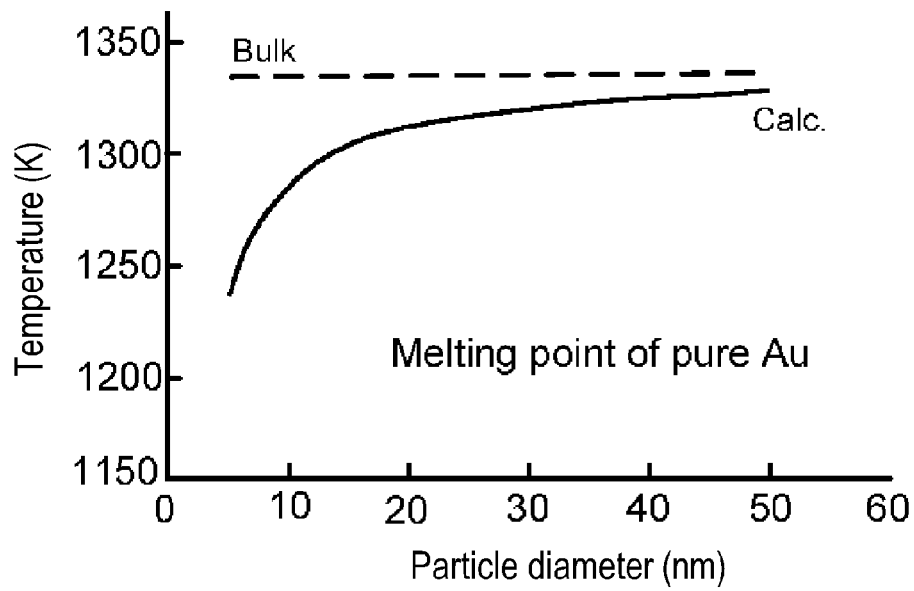
FIG. 9A is a graph showing a relationship between a gold particle diameter and a gold melting point.
Figure 9B:
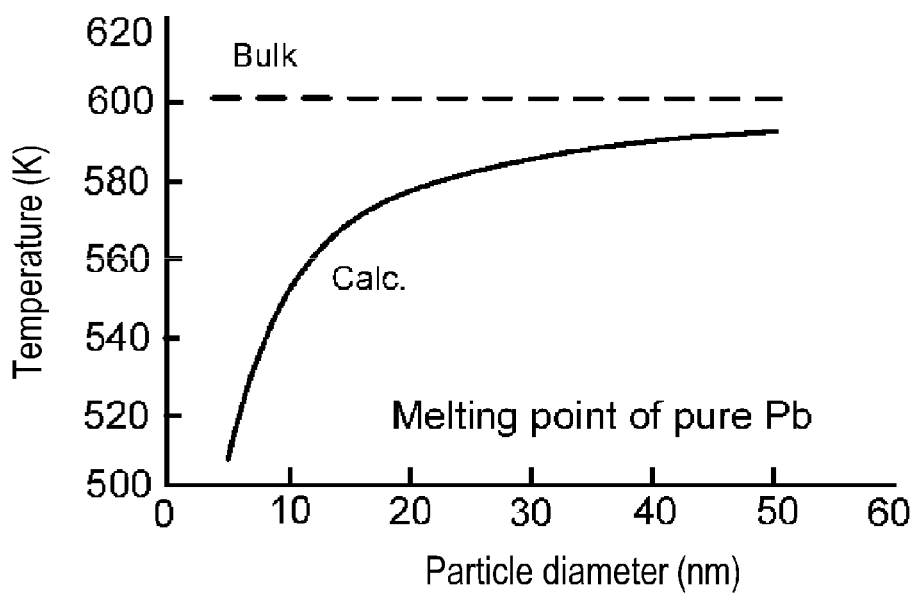
FIG. 9B is a graph showing a relationship between a lead particle diameter and a lead melting point.
Figure 9C:
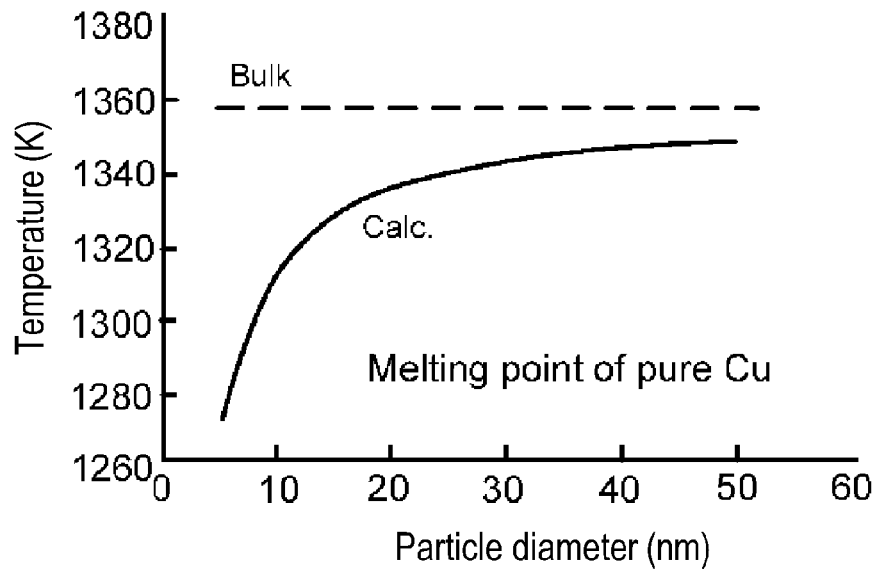
FIG. 9C is a graph showing a relationship between a copper particle diameter and a copper melting point.
Figure 9D:
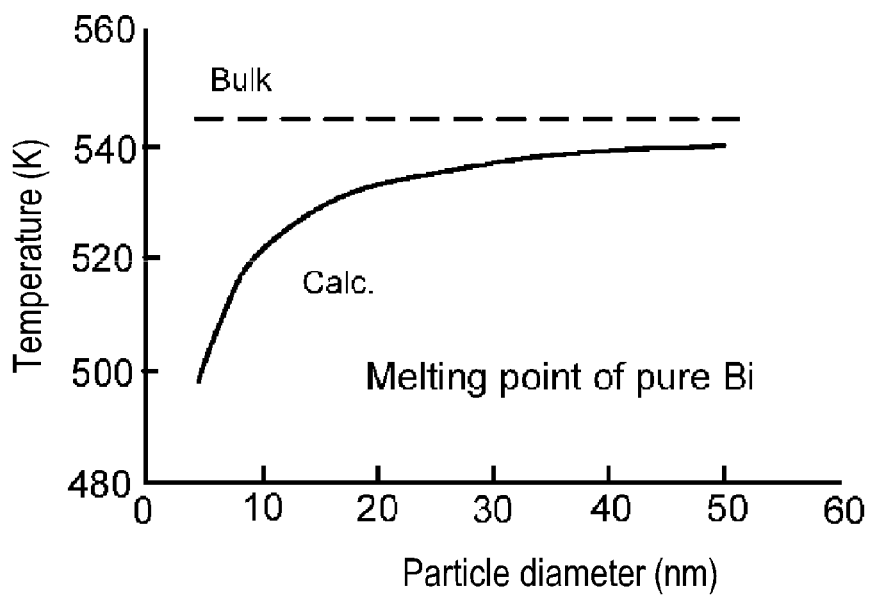
FIG. 9D is a graph showing a relationship between a bismuth particle diameter and a bismuth melting point.
Figure 9E:
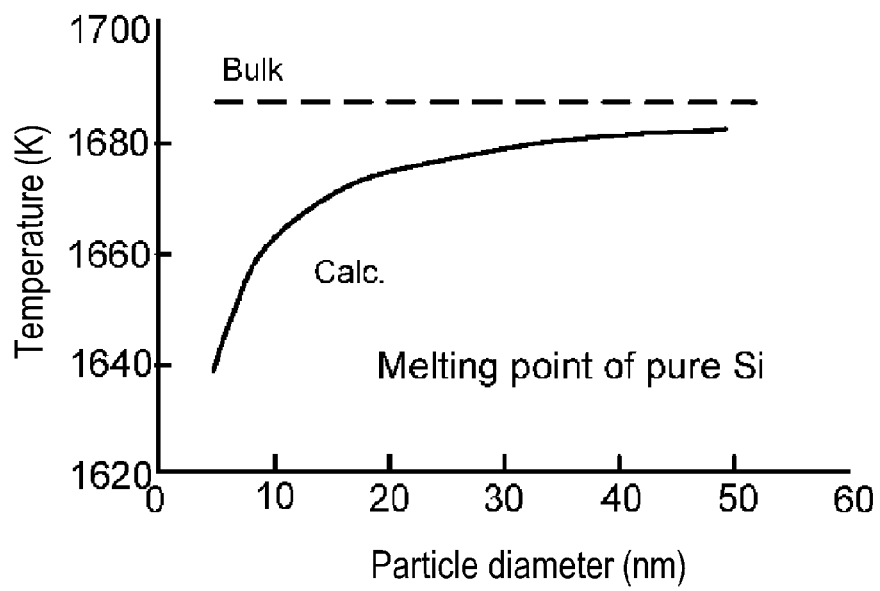
FIG. 9E is a graph showing a relationship between a silicon particle diameter and a silicon melting point.
Figure 9F:
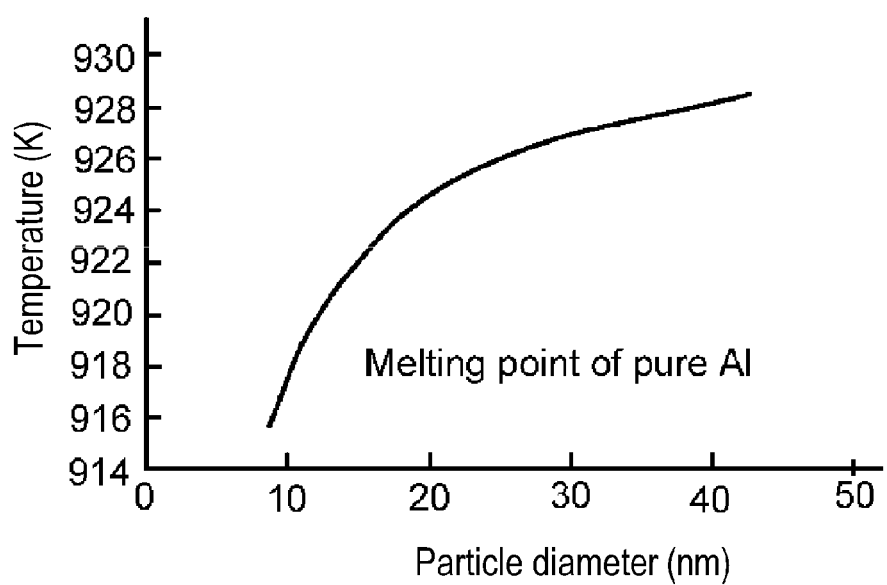
FIG. 9F is a graph showing a relationship between an aluminum particle diameter and an aluminum melting point.

Subsequently, a specific resistance when a through conductor is formed using the metal nano-particle paste and the metal nano-particle ink composed of silver particles will be described. FIG. 8D is a view showing a relationship between a silver sintering temperature and a silver specific resistance.

As shown in FIG. 8D, the specific resistance of silver particles tend to change depending on their sintering temperature. With an example of a sintering temperature of 300 degrees C. appropriate when the porous metal material (metal nano-particle paste) and the metal nano-particle ink using the silver particles are mixed to form the through conductor, it can be seen that the same degree of specific resistance as a general solder can be obtained. That is, when the sintering temperature is set to 250 to 350 degrees C., in some embodiments 250 to 300 degrees C., the porous metal material and the metal nano-particle ink can be integrally sintered while providing the same degree of specific resistance as the conventional solder with an insignificant effect on semiconductor devices.

For reference, a relationship between a particle diameter and a sintering temperature for each metal of gold (Au), lead (Pb), copper (Cu), bismuth (Bi), silicon (Si) and aluminum (Al) is shown in FIGS. 9A to 9F. As shown in FIGS. 9A to 9F, it can be seen that these metal particles have about two times or more the melting point of the general solder even if their diameter is decreased to 10 nm or so. That is, in the manufacturing method of the embodiment, it can be seen that the metal nano-particle paste and the metal nano-particle ink can be appropriately prepared using the silver particles.

(Example of Introduction of Metal Nano-Particle Paste)

Figure 10A:
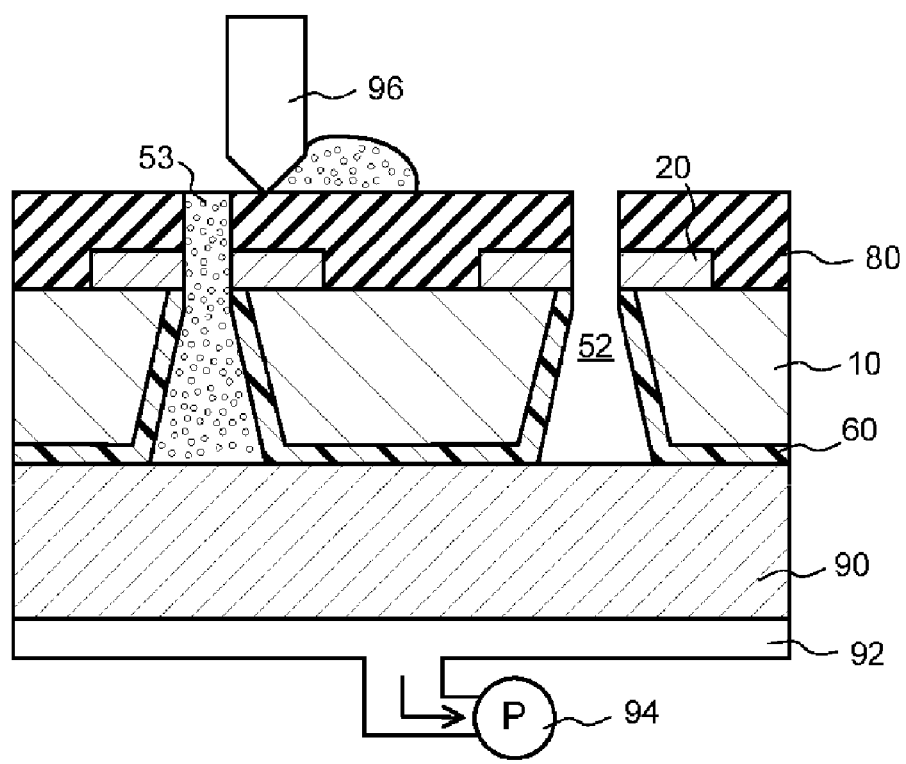
FIG. 10A is a view showing one example of a process of introducing metal nano-particle paste according to an embodiment.
Figure 10B:
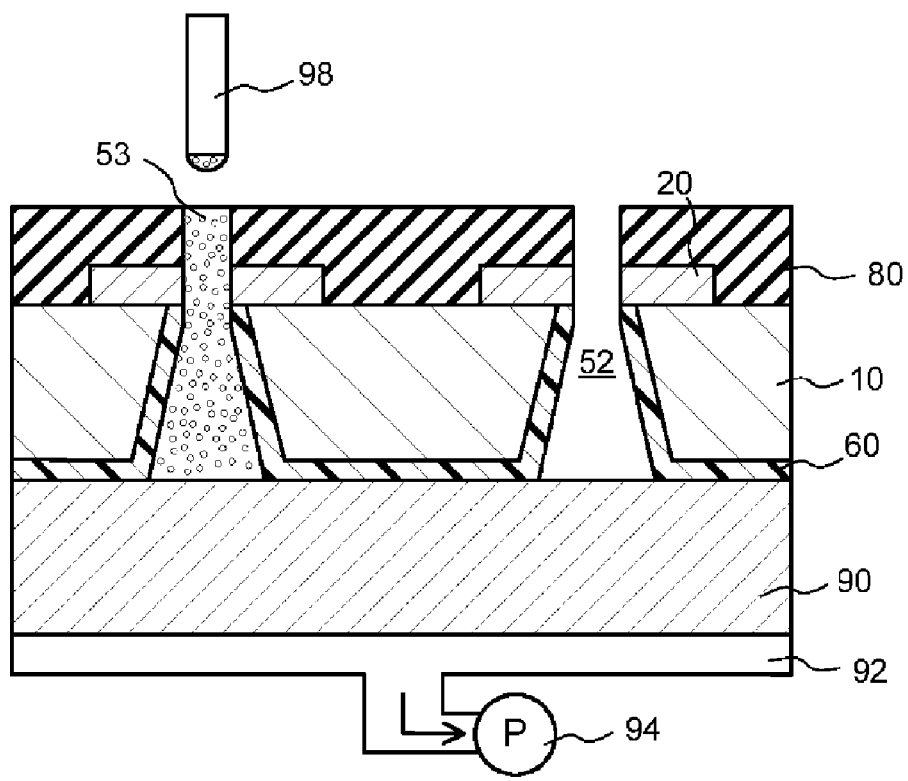
FIG. 10B is a view showing one example of a process of introducing metal nano-particle paste according to an embodiment.

Next, an example of introducing a metal nano-particle paste into the through via 52 formed in the device wafer 10 will be described with reference to FIGS. 10A and 10B. FIG. 10A shows an example of introducing the metal nano-particle paste 53 into the through via 52 using a squeegee and FIG. 10B shows an example of introducing the metal nano-particle paste 53 into the through via 52 using a supply nozzle. In the following description, the same elements as the wafer 10 shown in FIGS. 3A to 3G, FIGS. 4A to 4C, FIGS. 5A and 5B, and FIGS. 6A to 6D are denoted by the same reference numeral, an explanation of which will not be repeated.

In the process shown in FIG. 5A, a suction portion 92 and a suction pump 94 are connected to a surface other than a surface with the device wafer 10 disposed thereon in porous material 90 (FIG. 10A). After the suction pump 94 is driven to allow the suction portion 92 to make the internal pressure of the through via 52 negative through the porous material 90, the metal nano-particle paste 53 is applied on the dicing tape 80. Then, a squeegee 96 is used to introduce the metal nano-particle paste 53 in the through via 52. In the example shown in FIG. 10A, since the squeegee 96 is used to introduce the metal nano-particle paste 53 in the through via 52, it is possible to realize simple introduction of the metal nano-particle paste without requiring precision.

In the example shown in FIG. 10B, after the suction pump 94 is driven to allow the suction portion 92 to make the internal pressure of the through via 52 negative through the porous material 90, a nozzle 98 is used to supply the metal nano-particle paste 53 into the through via 52. In the example shown in FIG. 10B, since a required amount of metal nano-particle paste 53 can be supplied through each via 52, it is possible to form porous metal material with efficiency.

Although in the examples shown in FIGS. 10A and 10B, the metal nano-particle paste 53 is introduced from a side of the device wafer 10 at which the dicing tape 80 is formed, the present disclosure is not limited thereto. For example, the porous material 90 may be placed on the surface with the electrode pad 20 formed thereon and the metal nano-particle paste 53 may be introduced from the surface with the insulating layer 60 formed thereon. In addition, although in the examples shown in FIGS. 10A and 10B, the metal nano-particle paste 53 is directly supplied and applied on a surface of the dicing tape 80 (or the insulating layer 60), the present disclosure is not limited thereto. For example, a mask may be beforehand formed and the metal nano-particle paste 53 may be introduced through an opening formed in the mask. Alternatively, the metal nano-particle paste 53 may be introduced using a dispenser, a transfer pin, a roller or the like instead of the squeegee 96 or the nozzle 98.

(Example of Chip Stacking)

Next, an example of stacking the device wafer 10 (or the chips 2) will be described with reference to FIGS. 11A to 11E. Although in Step 224 of the embodiment, the device wafer 10 (or the chips 2) is stacked as it is, the device wafer 10 (or the chips 2) is temporarily fixed in the following example.

Figure 11A:
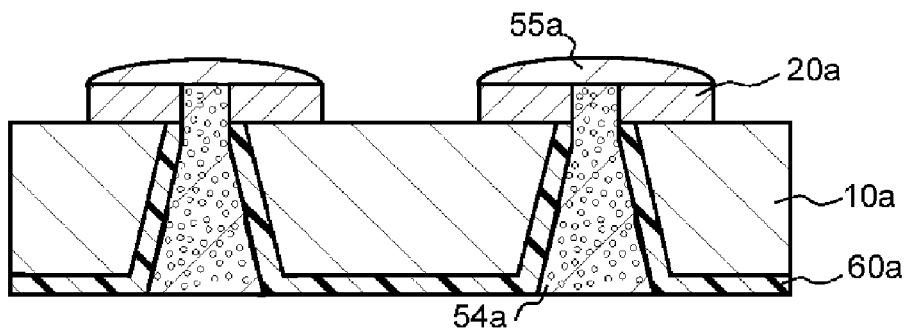
FIG. 11A is a view showing one example of a deposition process in a manufacturing method according to an embodiment.

For example, as shown in FIG. 11A, a temporary fixing portion 55a is formed on a surface of an electrode pad 20a formed in the device wafer 10a using the same paste as the metal nano-particle paste 53. The temporary fixing portion 55a is in some embodiments prepared using the same kind of metal particles as the metal nano-particle paste 53.

Figure 11B:
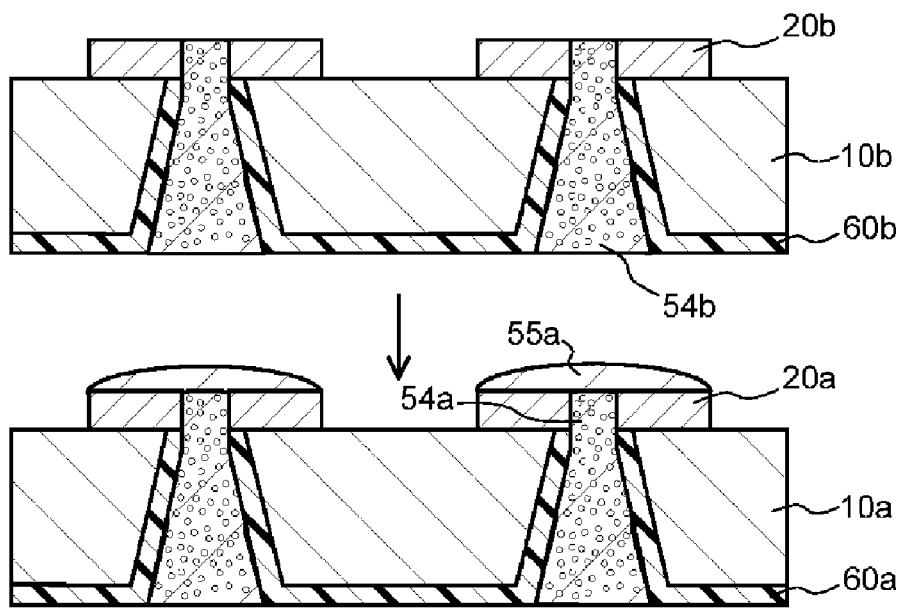
FIG. 11B is a view showing one example of a deposition process in a manufacturing method according to an embodiment.

Subsequently, as shown in FIG. 11B, the device wafers 10a and 10b are stacked with the temporary fixing portion 55a formed on the electrode pad 20a of the device wafer 10a facing porous metal material 54b at the surface of the device wafer 10b with an insulating layer 60b formed thereon.

Figure 11C:
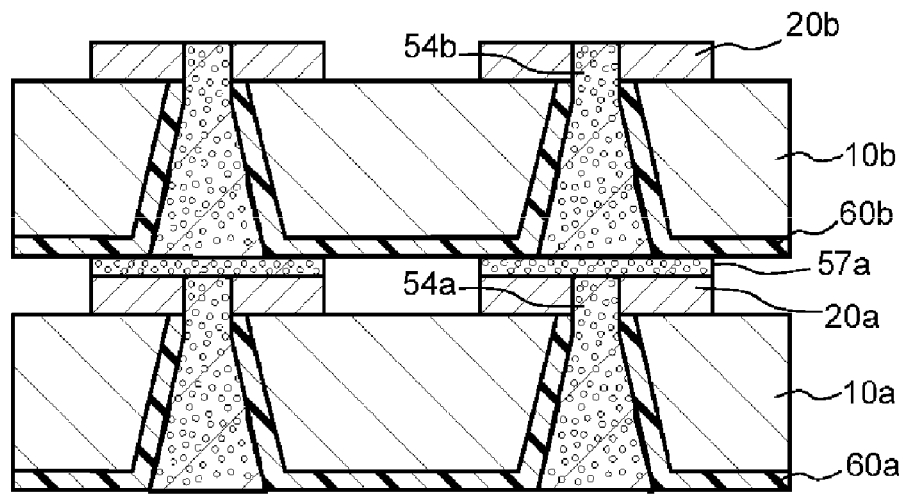
FIG. 11C is a view showing one example of a deposition process in a manufacturing method according to an embodiment.

After the device wafers 10a and 10b are stacked, they are temporarily sintered (FIG. 11C). This temporary sintering allows the temporary fixing portion 55a to be changed into porous metal material 57a. Then, the device wafers 10a and 10b are adhered together.

Figure 11D:
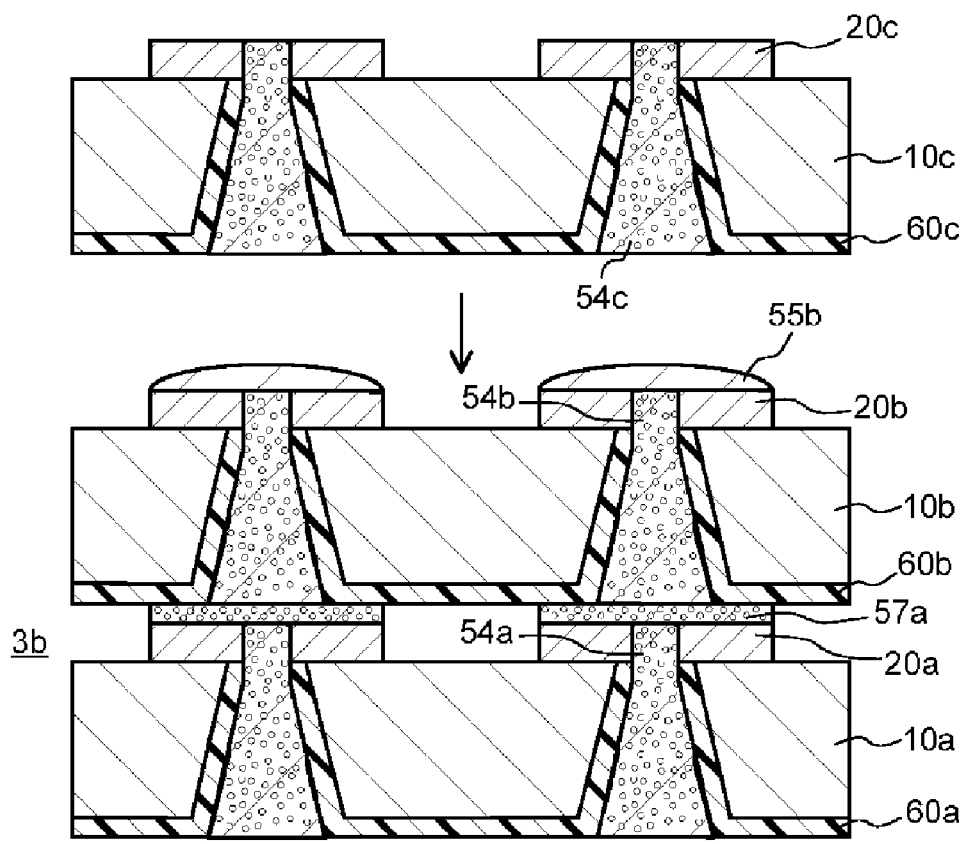
FIG. 11D is a view showing one example of a deposition process in a manufacturing method according to an embodiment.

Subsequently, a temporary fixing portion 55b is formed on an electrode pad 20b of the device wafer 10b. The temporary fixing portion 55b may use the same paste used for the temporary fixing portion 55a. After the temporary fixing portion 55b is formed on the electrode pad 20b, the device wafers 10a and 10b and the device wafer 10c are stacked with the electrode pad 20b facing porous metal material 54c and insulating layer 60c of the device wafer 10c (FIG. 11D).

Figure 11E:
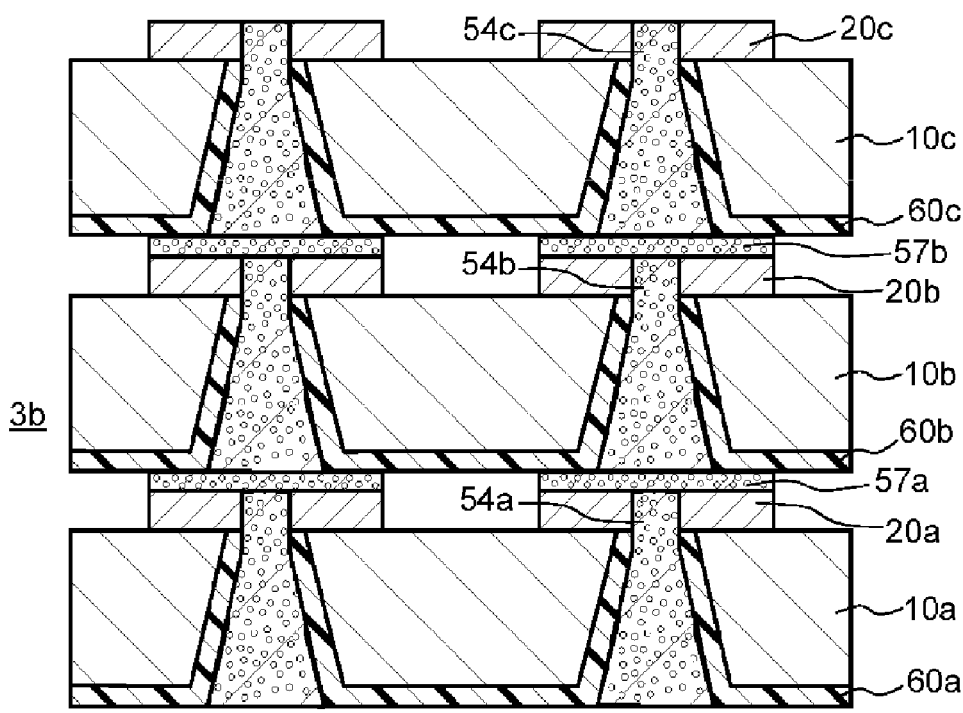
FIG. 11E is a view showing one example of a deposition process in a manufacturing method according to an embodiment.

After the device wafers 10a and 10b and the device wafer 10c are stacked, they are temporarily sintered (FIG. 11E). This temporary sintering allows the temporary fixing portion 55b to be changed into porous metal material 57b. Then, the device wafers 10b and 10c are adhered together.

For a stack 3b temporarily fixed by the temporary fixing portions 55a and 55b, metal nano-particle ink is injected into the porous metal materials 54a to 54c and then the stack 3b is mainly sintered such that an integrated through conductor can be formed.

In the examples shown in FIGS. 11A to 11E, a precision of forming the through conductor can be increased since the porous temporary fixing portions 55a and 55b are used to align the device wafers 10 or the chips 2. In addition, since the temporary fixing portions 55a and 55b are made of porous metal material, an integrated through conductor can be formed using metal nano-particle ink.

Although in this example the metal nano-particle paste is temporarily sintered to form the temporary fixing portions, the present disclosure is not limited thereto. For example, porous metal material may be directly placed in the electrode pad 20 to form the temporary fixing portions. In this case, the temporary sintering is not required. In addition, although in this example the temporary fixing portions are formed on the electrode pad, the same effects can be obtained even when the temporary fixing portions are formed in an end portion of porous metal material exposed from the through via. In addition, although in this example the temporary fixing portions are formed on the electrode pad, the temporary fixing portions may be formed in an end portion of porous metal material at the surface with the insulating layer formed thereon of the device wafer.

In this manner, according to the manufacturing method of the embodiment, even when the through conductor is formed in a fine through via, it is possible to realize a uniform through conductor with no void since there is no need for a large-scaled vacuum pressurizing apparatus or the like.

In addition, according to the manufacturing method of the embodiment, the number of processes can be reduced since there is no need for a vacuum apparatus, a plating apparatus, a reduction apparatus, a resist application and so on. In particular, in the manufacturing method of the embodiment, processes can be simplified since the through conductor can be formed at a relatively low temperature, thereby requiring no sputter apparatus, CVD apparatus and plating apparatus.

In addition, in the manufacturing method of the embodiment, resistance can be lowered since there is no need for solder and conductive adhesive for chip stacking and through via forming.

According to some embodiments of the present disclosure, it is possible to provide a semiconductor device manufacturing method which is capable of easily realizing formation of through electrodes on chips and connection between the through electrodes.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method for manufacturing a semiconductor device, the method comprising:
   providing a plurality of semiconductor substrates formed with through holes which penetrate between main surfaces of the substrates and are filled with porous conductors;
   stacking the plurality of semiconductor substrates while aligning the porous conductors filled in the through holes;
   introducing conductive ink containing particle-like conductors into the porous conductors of the plurality of stacked semiconductor substrates; and
   sintering the plurality of stacked semiconductor substrates.

2. A method for manufacturing a semiconductor device, the method comprising:
   forming a plurality of chip areas on semiconductor substrates, each of the plurality of chip areas having through holes penetrating between main surfaces of the substrates;
   filling the through holes with porous conductors;
   cutting a plurality of chips from the plurality of chip areas;
   stacking the plurality of chips cut from the plurality of chip areas into a plurality of stacked chips while aligning the porous conductors;
   introducing conductive ink containing particle-like conductors into the porous conductors of the plurality of stacked chips; and
   sintering the plurality of stacked chips.

3. The method of claim 2, wherein the porous conductors are formed by temporary sintering after a particle-like silver solution is introduced into the through holes and a conductive solution containing the particle-like conductors is a silver-containing solution.

* * * * *